US006413353B2

(12) United States Patent
Pompeo et al.

(10) Patent No.: US 6,413,353 B2
(45) Date of Patent: *Jul. 2, 2002

(54) METHOD FOR DIRECT ATTACHMENT OF A CHIP TO A COOLING MEMBER

(75) Inventors: Frank Louis Pompeo, Montgomery, NY (US); Alain A. Caron, Quebec (CA); Jeffrey Thomas Coffin, Pleasant Valley; Jeffrey Allen Zitz, Poughkeepsie, both of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/241,238

(22) Filed: Feb. 1, 1999

Related U.S. Application Data

(62) Division of application No. 08/918,615, filed on Aug. 22, 1997.

(51) Int. Cl.[7] ............................................. B32B 31/26
(52) U.S. Cl. .................................... 156/307.3; 438/119
(58) Field of Search .......................... 156/306.6, 307.1, 156/307.3; 257/707, 713, 712, 718, 721, 796; 438/108, 118, 119, 122

(56) References Cited

U.S. PATENT DOCUMENTS

| 4,087,585 A | | 5/1978 | Schulz |
| 4,849,856 A | * | 7/1989 | Funari et al. ................ 361/386 |
| 4,939,570 A | * | 7/1990 | Bickford et al. .............. 357/81 |
| 4,999,699 A | | 3/1991 | Christie et al. |
| 5,056,296 A | * | 10/1991 | Ross et al. ..................... 53/478 |
| 5,081,067 A | * | 1/1992 | Shimizu et al. ............. 437/209 |
| 5,367,193 A | | 11/1994 | Malladi |
| 5,455,457 A | * | 10/1995 | Kurokawa ................... 257/712 |
| 5,471,027 A | * | 11/1995 | Call et al. ................. 219/85.13 |
| 5,523,260 A | * | 6/1996 | Missele ....................... 437/209 |
| 5,533,256 A | | 7/1996 | Call et al. |
| 5,548,482 A | | 8/1996 | Hatauchi et al. |
| 5,572,070 A | * | 11/1996 | Ross ........................... 257/713 |
| 5,572,405 A | * | 11/1996 | Wilson ........................ 361/764 |
| 5,744,863 A | | 4/1998 | Culnane et al. |
| 5,777,847 A | * | 7/1998 | Tokuno et al. .............. 361/705 |
| 5,847,929 A | * | 12/1998 | Bernier et al. .............. 361/719 |
| 5,956,576 A | * | 9/1999 | Toy et al. .................... 438/125 |

OTHER PUBLICATIONS

Vanwert et al., One–Part Thermal–Cure Silicone Adhesives, Proceedings of the Technical Progam, NEPCON West '96, vol. 2. pp. 797–804, Anahiem, California, Feb. 27–29, 1996.*
Wilson et al., Thermally Conductive Adhesives for High Thermally Stressed Assembly, Proceddings of the Technical Program, NEPCON West '96, vol. 2, pp. 788–796, Anahiem, California, Feb. 27–29, 1996.*
Information About High Technology Silicone Materials, Dow Corning.
Information About Dow Corning® 340 Heat Sink Compound, Dow Corning.

* cited by examiner

Primary Examiner—Michael W. Ball
Assistant Examiner—Gladys Piazza
(74) Attorney, Agent, or Firm—DeLio & Peterson, LLC; Kelly M. Reynolds; Steven Capella

(57) ABSTRACT

A semiconductor chip module uses a silicone adhesive between the semiconductor chip and a cap, said adhesive having sufficient bond strength to secure said cap to said chip without additional mechanical constraint while providing a direct thermally conductive path and permitting sufficient heat flow from said chip to said cap to maintain steady state operation of said semiconductor chip. The preferred silicone adhesive comprises a primerless, two-part polysiloxane-based adhesive made by reacting polydimethyl siloxane, an organosilicon compound, a polysiloxane, and a silane, in the presence of a catalyst.

15 Claims, 4 Drawing Sheets

METHOD FOR DIRECT ATTACHMENT OF A CHIP TO A COOLING MEMBER

This is a divisional of copending application Ser. No. 08/918,615 filed on Aug. 22, 1997.

BACKGROUND OF THE INVENTION

1. Field of the Invention

The present invention relates generally to a semiconductor chip assembly and, in particular, to an apparatus that uses a flexible, silicone elastomer adhesive to directly join a chip or plurality of chips to one or several cooling members.

2. Description of Related Art

Semiconductor devices are continually becoming smaller and more dense with the evolution of new technology. However, increases in circuit density produce corresponding changes in overall chip packaging strategies in order to remain competitive. Chip and chip carrier manufacturers are therefore constantly challenged to improve the quality of their products by identifying and eliminating problems, reducing package size and weight, decreasing package costs and providing improved thermal efficiencies with new generations of advanced devices. Whereas significant improvements are being made to eliminate systematic problems by reducing process variability, process improvements alone are not sufficient to eliminate all the problems which affect both performance and reliability.

FIG. 1 illustrates a currently employed method and apparatus for sealing a metal cap 11', to a ceramic substrate 12, by means of a sealant or adhesive bond 13. Typically, chip 14, is first secured to a substrate 12, via a plurality of solder balls 15 on pads 16 that reside on the top surface of the substrate 12. Substrate 12 could also have one or more electronic devices 17 such as a decoupling capacitor 17 that is also electrically connected to substrate 12, via metallized pads 16 and either solder balls or surface mountable solder. For some applications solder balls 15 and pads 16 could be encapsulated with a polymeric underfill material 18. A semi-liquid or paste type thermally conductive material 19 is usually applied over the exposed surface of chip 14 such that a direct thermal contact is made between the chip 14 and the cap 11' when cap 11' is placed so as to cover chip 14. A cap adhesive sealant 13 is typically provided in order to secure cap 11' to the substrate or module 12. Heatsink 20 can be secured to cap 11' using a heatsink adhesive 21. Substrate 12 is typically secured electrically and mechanically to a mother board, card or socket 22, via I/O (Input/Output) means 23, such as pads, pins, solder balls, solder columns, etc.

Cap 11', typically fashioned from metals or ceramics having either high thermal conductivity and/or matched thermal expansivity to the chip carrier, is placed over chip 14 and is permanently secured to the surface of substrate 12. As shown, cap 11' has sidewall portions 11a and usually completely seals the sides of the chip module from the surrounding environment. This is done primarily to prevent mechanical and chemical injury to chip 14, solder balls 15, decoupling capacitors 17, underfill 18 and any exposed metallurgy or circuitry on the substrate 12. It is well known that a leak in cap 11' may result in irrecoverable module yield losses and degrade expected reliability performance under actual use conditions. A picture-frame type area on the top surface of the substrate 12 is required to specifically seal cap 11' to substrate 12 using cap sealant 13. The width of this frame type will vary as a function of overall substrate size, using experimentally derived data, but includes the actual seal area in addition to associated required clearances 16, 17 around the seal to eliminate sealant runover or mechanical damage to devices during assembly. Therefore, the placement of all devices, such as, for example, chips 14, decoupling capacitors 17, is restricted to be within this picture frame area, which is typically 50 percent, of the area that would otherwise be available for additional or larger devices. Additionally, cap 11' typically adds between 30 percent and about 50 percent to the overall height of the module. Furthermore, the presence of cap 11' adds additional weight to the completed or assembled module.

The entirely enclosed internal cavity 28 created by the cap and seal will tend to trap moisture. This leads to high internal pressures and related damage during high temperature (above 100° C.) operations, such as joining the module to a mother board. This phenomenon, known in the industry as "moisture sensitivity," drives added cost through special handling and preparation procedures, such as dry-bagging with dessicants and ambient exposure time limits to minimize the amount of moisture in the chip carrier prior to high temperature processes.

Thermal compound 19 must be placed between chip 14 and cap 11' to provide an efficient heat transfer path via the heatsink adhesive 21 to the heatsink 20. The thermal compound is typically of semi-liquid or paste consistency to absorb the large thermally induced strains associated with this "doubly-connected" structure before they are transmitted to and damage the chip 14.

In some cases, thermally conductive epoxies have been used to provide a better thermal contact between the chip and the heat sink, while others have used thermally conductive pastes, greases and/or oil films. For example, U.S. Pat. No. 5,367,193 discloses use of Dow Corning 340 heat sink compound, which is a grease-like silicone material filled with metal oxide filler, in conjunction with a multistructural mechanical support. All of these methods suffer from one or more drawbacks, such as poor thermal performance, brittleness at low temperatures, material flow or movement over time, or the need for secondary mechanical support.

Bearing in mind the problems and deficiencies of the prior art, it is therefore an object of the present invention to provide an apparatus which has a thermally conductive mechanically robust path between at least one chip and at least one cooling member.

Yet another purpose of the invention is to increase the available area on the substrate or the chip carrier for device joining, for example, active devices, such as chips, or passive devices, such as capacitors, resistors, etc.

Another purpose of the invention is to provide a method and apparatus to support high cooling member weights, for example, lid plus heat sink assemblies of at least 100 grams.

Another purpose of the invention is to provide a method and apparatus for ensuring the mechanical and operational integrity of the bond between devices and the cooling member under typical use conditions such as gravity, mechanical shock, vibration, high temperature with humidity and repeated thermal expansion/contraction cycles due to temperature variation.

Still another purpose of the invention is to provide a method and apparatus that will minimize thermal performance degradation over the chip carrier life.

Still yet another purpose of the invention is to provide a method and apparatus that will absorb thermally inducted strain without damage to the chip carrier or associated devices.

Yet another purpose of the invention is the ability to rework or repair the completed or assembled module in a simple, efficient manner. still other objects and advantages of the invention will in part be obvious and will in part be apparent from the specification.

SUMMARY OF THE INVENTION

The above and other objects, which will be apparent to those skilled in the art, are achieved in the present invention which provides in one aspect a chip assembly comprising a substrate having an upper surface for carrying one or more semiconductor chips, at least one semiconductor chip mounted on the upper surface of the substrate and a cap covering the semiconductor chip and the upper surface of the substrate. A silicone adhesive is placed between the semiconductor chip and the cap. The adhesive has sufficient bond strength to secure the cap to the chip without additional mechanical constraint while providing a direct thermally conductive path and permitting sufficient heat flow from the chip to the cap to maintain steady state operation of the semiconductor chip.

The invention is useful where the cap has a coefficient of thermal expansion significantly greater than that of the semiconductor chip. The cap may extend horizontally outward of the chip, and the chip or the silicone adhesive may be at least partially exposed to the environment outside of the assembly between the cap and the substrate. The chip may be secured to the substrate by an electrical connection selected from the group consisting of solder balls, solder columns, low melting point solder and high melting point solder, and the electrical connection may be encapsulated with an underfill material. In such case, the cap may extend horizontally outward of the chip, and the underfill material is at least partially exposed to the environment outside of the assembly between the cap and the substrate.

The cap preferably has a substantially flat upper free surface and may comprise a heat sink for the chip. There may be a plurality of semiconductor chips mounted on the upper surface of the substrate having different heights, such that the cap covers the semiconductor chips and the upper surface of the substrate, and the silicone adhesive is disposed between the semiconductor chips and the cap at different thicknesses dependent on the height of a chip. The assembly may also include at least one additional electronic device secured to the substrate and disposed under the cap.

In one embodiment, the cap includes a support member extending horizontally beyond a peripheral edge of the chip and downward to the substrate and secured thereto.

The assembly may further include a plurality of semiconductor chips mounted on the upper surface of the substrate, wherein the cap covers the semiconductor chips and the upper surface of the substrate such that the silicone adhesive is disposed between fewer than all of the semiconductor chips and the cap.

In another aspect, the present invention provides a method of providing a direct thermally conductive path between at least one chip and at least one heatsink cap. The method comprises initially providing a substrate having an upper surface for carrying one or more semiconductor chips and at least one semiconductor chip mounted on the upper surface of the substrate, and a heatsink cap for covering the semiconductor chip and the upper surface of the substrate. The method then includes the steps of applying a silicone adhesive between the semiconductor chip and the cap, securing the cap to the substrate by means of a mechanical fixture, curing the silicone adhesive, and removing the mechanical fixture. The cured adhesive has sufficient bond strength to secure the cap to the chip without additional mechanical constraint while providing a direct thermally conductive path and permitting sufficient heat flow from the chip to the cap to maintain steady state operation of the semiconductor chip.

The method may further include the step of securing at least one portion of the chip to a substrate using at least one electrical connection.

The silicone adhesive preferably. comprises a primeness, two-part polysiloxane-based adhesive made by reacting polydimethyl siloxane, an organosilicon compound, a polysiloxane, and a silane, in the presence of a catalyst, and optionally includes a thermally conductive material. The silicone adhesive is preferably cured to support a cooling member mass of at least 100 grams.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
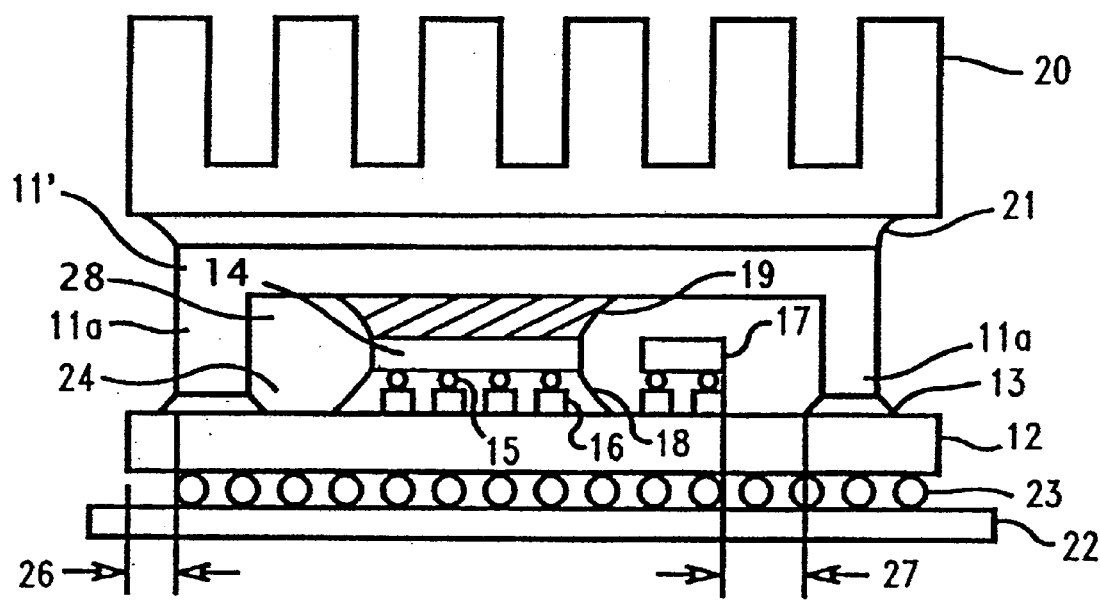
FIG. 1 is a sectional elevational view of one prior art scheme to encapsulate a flip-chip device.

In describing the preferred embodiment of the present invention, reference will be made herein to FIGS. 1–8 of the drawings in which like numerals refer to like features of the invention. Features of the invention are not necessarily shown to scale in the drawings.

Designers of ceramic chip carriers are under ever increasing pressure to maximize the utilization of available top surface design space to package electronic components, giving the highest regard to cost and space efficiency. This invention describes one way to reduce cost of such packages without any loss or degradation of their performance. Packaging methods which reduce cost advantageously increase the availability of such electronic packages in the marketplace.

Figure 2:
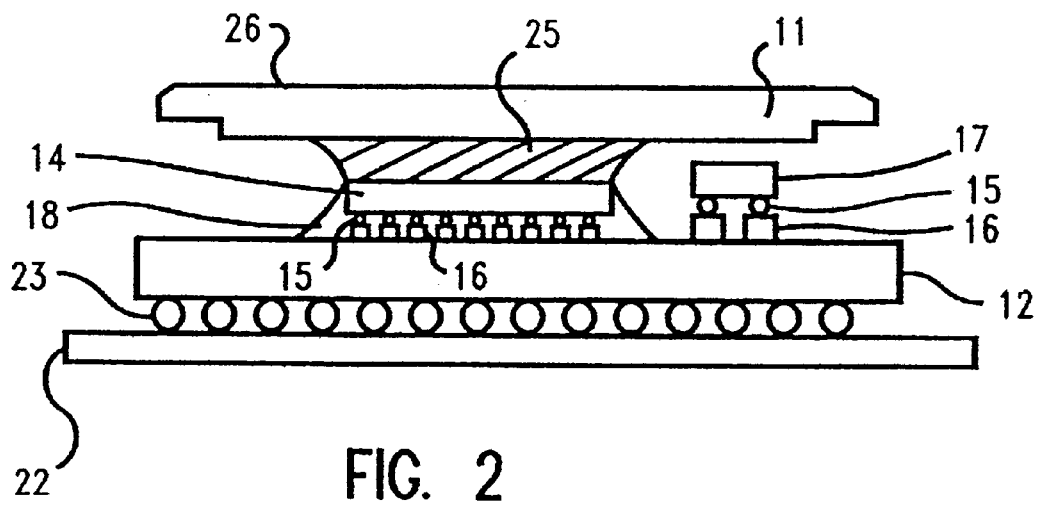
FIG. 2 is a sectional elevational view of a preferred embodiment of this invention showing a lid adhered to an underlying chip with a silicone adhesive.

FIG. 2 illustrates a preferred embodiment of the present invention. Ceramic semiconductor chip 14 is connected to substrate 12 by solder balls 15 on pads 16. Chip underfill material 18 encapsulates at least a portion, and preferably all, of solder balls 15 and pads 16 and serves two purposes, to improve the solder ball fatigue reliability and to provide an effective barrier against environmental and process exposures. A preferred underfill material is prepared by curing a preparation containing a cycloaliphatic polyepoxide and/or curable cyanate ester or prepolymer thereof and a filler having a maximum particle size of 31 microns and being substantially free of alpha particle emissions, as disclosed in U.S. Pat. No. 4,999,699, the disclosure of which is hereby incorporated by reference. One such underfill is available as EXP5341 from Polyset Corporation under license from IBM Corporation. Ceramic substrate 12 is itself attached to card or motherboard 22 by the aforementioned via I/O means 23. Protective cap 11 is secured to the upper or exposed surface of chip 14 with a silicone elastomer based adhesive 25. It has now been found that a flexible heat-curable silicone elastomer adhesive can readily provide both highly efficient thermal transfer between chip 14 and cap or lid 11 in addition to affording long term reliability to the chip. Adhesive flexibility is retained down to operating temperatures of −55° C. due to the low glass transition temperature inherent to silicone elastomeric adhesive systems.

Selection of silicone elastomer adhesive 25 to be used depends on several factors and can affect the final thermal and mechanical attributes of the chip carrier. Low thermal conductivity adhesives (without additional thermally conductive fillers or additives) require a thin bond line for acceptable thermal performance, preferably in the range of about 5 to 25 μm thickness. The preferred silicone adhesive is a primeness polysiloxane-based adhesive produced from a flowable two-part, heat curable silicone elastomer that is able to closely bond a ceramic chip to an overhead aluminum cap over the entire chip area, wherein the difference in thermal expansion over such area is approximately one order of magnitude (i.e., about 3 ppm/° C. for the silicon chip to about 22 ppm/° C. for the aluminum cap). The adhesive may be made by reacting polydimethyl siloxane, an organosilicon compound of units such as trimethylsiloxy units, dimethylsiloxane unit, methylhydrogensiloxane unit or dimethylhydrogensiloxy unit, a polysiloxane of units such as dimethylsiloxane unit or methylvinylsiloxane unit, and a silane such as mono (epoxyorgano) trialkyloxysilane, in the presence of a platinum catalyst. Such silicone elastomers are disclosed in U.S. Pat. No. 4,087,585, the disclosure of which is hereby incorporated by reference. The preferred silicone adhesive is sold under the trademark SYLGARD 577 by Dow Corning Corporation of Midland, Mich.

Such polysiloxane adhesives with high conductivity fillers such as alumina or aluminum nitride can be selected for increased thermal conductivity and thus larger allowable bond thicknesses. Adhesives with known size particles such as glass spheres can be used to achieve a specific bond thickness and specific adhesives can be selected in order to maximize flexibility and absorb thermally induced strains.

Figure 3:
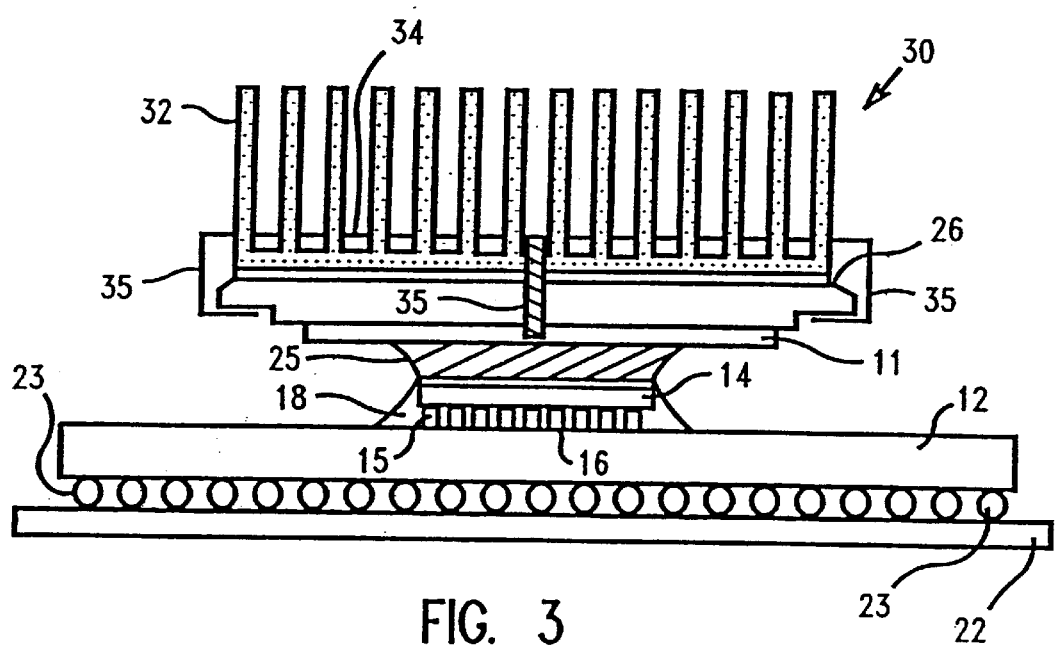
FIG. 3 is a sectional elevational view of a preferred embodiment of this invention showing a lid adhered to an underlying chip with a silicone adhesive and a heat sink mechanically attached to the lid.

Lid 11 may be made from a variety of engineering materials such as alloys of aluminum or copper for high thermal transfer, or Kovar (available from Westinghouse Corp.), metal laminates, composites or ceramics for controlled lid thermal expansion properties. The lid surface is preferably prepared in such a way as to eliminate undesirable effects, such as, for example, loss of adhesion due to corrosion, moisture outgassing or contamination. For example, this may be accomplished by a thin controlled anodization layer on the aluminum alloy used to make the lid. The lid preferably has an essentially flat or planar upper surface 26 and may itself be used as a free surface for heat sinking purposes, or may accommodate an additional simple, clip-on heat sink. Heat sink mechanically attached to the silicone-adhered lid of the present invention is shown in FIG. 3. Heat sink 30 having upward extending fins 32 is in thermal and physical contact with the upper surface 26 of lid 11. A spring clip 34 having downward extending spring arms secures heat sink 30 around the peripheral edges of lid 11.

Figure 4:
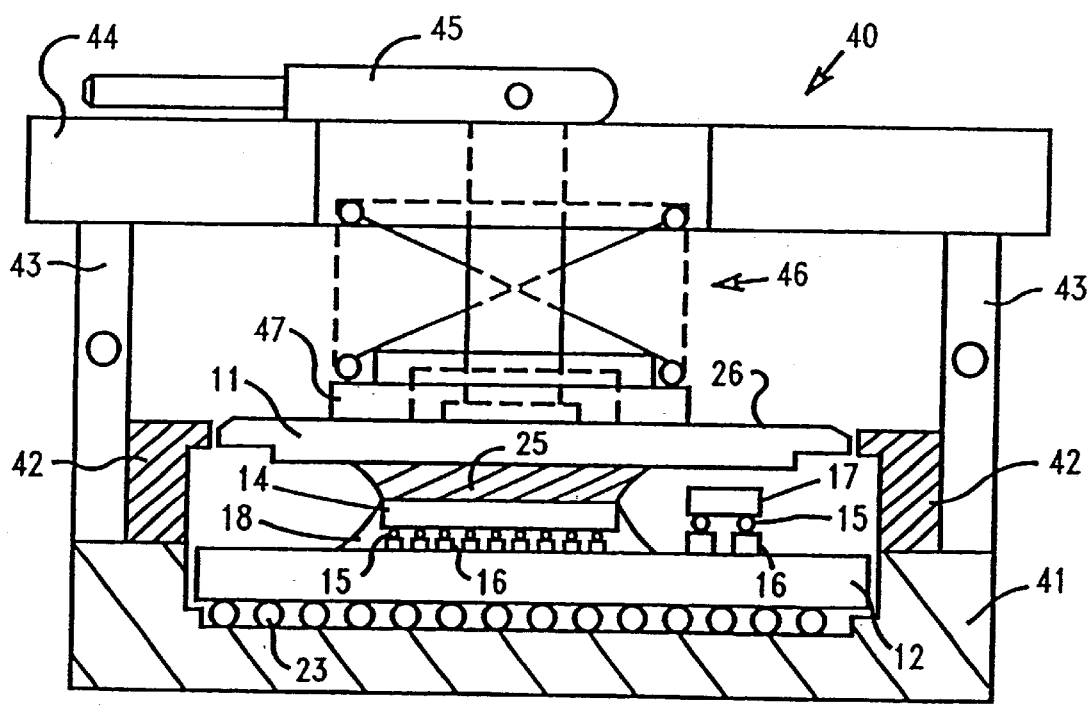
FIG. 4 is a sectional elevational view of a preferred embodiment of this invention showing an apparatus for adhering a lid to an underlying chip with a silicone adhesive.

Securing cap or lid 11 to chip 14 is accomplished by first mixing the components of the selected silicone elastomer if necessary and then applying the selected flexible silicone elastomer 25 to either the top surface of chip 14 or to the corresponding area on cap 11. Lid 11 is then accurately aligned to chip 14 by means of mechanical fixturing which can use, for example, spring loaded pads to rigidly fix lid 11 to the chip 14 while the entire module assembly is heated. An apparatus for securing the lid to the chip by the silicone adhesive is shown in FIG. 4. Fixture 40 contains base 41 having an internal cavity for receiving the module assembly of substrate 12 and electrical connections 23, on which is disposed chip 14 connected thereto as discussed above. Lid 11 is received in lid alignment frame 42 on base 41. Standoff posts secure top bar assembly 44 above base 41. Spring assembly 46 is disposed between pressure pad 47 and top bar assembly 44 to apply pressure as pad 47 contacts the upper surface 26 of lid 11. Toggle handle 45 is movable to engage the spring assembly and pressure pad against the lid, as shown in FIG. 4. In operation, the module assembly is loaded into base 41 and the top bar assembly is removed to have access to the module upper surface, and lid alignment frame 42 is placed on base 41. The silicone adhesive is applied to the top surface of chip 14 and/or the underside of lid 11, and lid 11 is placed over the remaining module assembly within the opening defined by alignment frame 42. Top bar assembly is brought back into position with posts 43 and toggle 45 is swung 180° to apply pressure, via spring assembly 46 and pressure pad 47, to the top 26 of lid 11.

Curing of silicone elastomer 25 is normally accomplished by heating the fixture and module assembly in a suitable apparatus, for example, a convection oven, to a temperature of 150° C. for one hour. A uniform bond line thickness may be achieved through selection of filler particle size in the selected silicone elastomer and/or parallel registration of the chip to the cooling member surface by a centered application of the fixture load.

For most applications, lid 11 will horizontally overhang the edges of chip 14, i.e. the outer edge portions of lid 11 extend beyond the outer edge portions of the chip 14. Thus, visible silicone elastomer is hidden, yielding a more aesthetically pleasing overall package. Care should be taken such that lid 11 does not interfere with other electronic components that may be on or near substrate 12.

The simplified electronic package of this invention will replace the prior art cap/seal/thermal compound encapsulation system. As can be seen in FIG. 2, the elimination of the prior art cap 11' with sidewalls, thermally conductive material 19, cap sealant 13 and heatsink adhesive 21 makes it possible to realize gains in MLC (Multi Layer Ceramic) packaging. The same chip is now closer to the heatsink or heat radiator 20 such that chip 14 will cool faster and more efficiently. Additionally, much more real estate is now available on the surface of substrate 12 for the placement of additional potentially larger electronic components. Conversely a smaller substrate could be used to achieve the same function achieving higher overall packaging density and lower cost through miniaturization.

Figure 5:
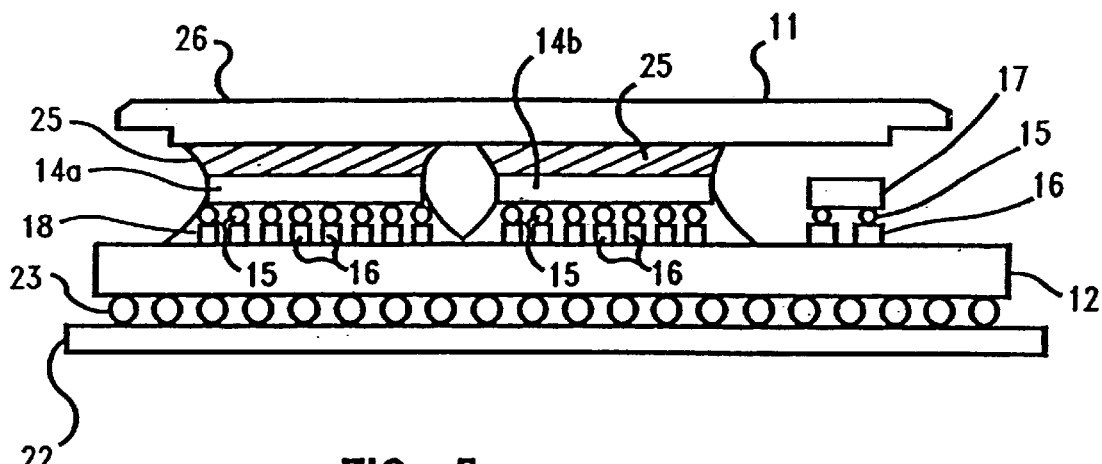
FIG. 5 is a sectional elevational view of yet another preferred embodiment of this invention showing multiple chips under a lid.

FIG. 5 illustrates another preferred embodiment of this invention, where substrate 12 contains a plurality of chips 14a, 14b all requiring efficient heat removal as afforded by this invention as shown in FIG. 1. As shown previously, chips 14a, 14b are connected to substrate 12 by solder balls 15 on pads 16, and the electrical connection from the substrate 12 to the card or socket 22 is provided via I/O means 23 which can be pads, pins, solder balls, solder columns. The selected flexible, silicone elastomer 25 is applied to either the top surfaces of chips 14 or lid 11, and is mechanically fixtured by means of, for example, spring-loaded pads and heat cured to a temperature of, for example, 150° C. for one hour. As shown previously in connection with FIG. 2, the chips in the embodiment of FIG. 5 are also encapsulated with a preferred underfill material 18 which both improves fatigue life performance of solder balls 15 on pads 16 as well as providing protection from environmental and process exposures. Lid 11 is designed to be essentially flat and is temperature stable to withstand processing rigors as well as to provide an effective adherence surface for the silicone elastomer. Control of the adhesive gap between chips 14a, 14b and lid 11 is a function of the individual planarity as well as flatness tolerances of substrate 12, solder balls 15, chips 14a, 14b and lid 11. For effective heat removal and performance, this gap should be maintained at a designed value, for example, less than 1.0 mil in thickness for low thermal conductivity silicone elastomers and less than about 5.0 mils for high thermal conductivity silicone elastomers.

Figure 6:
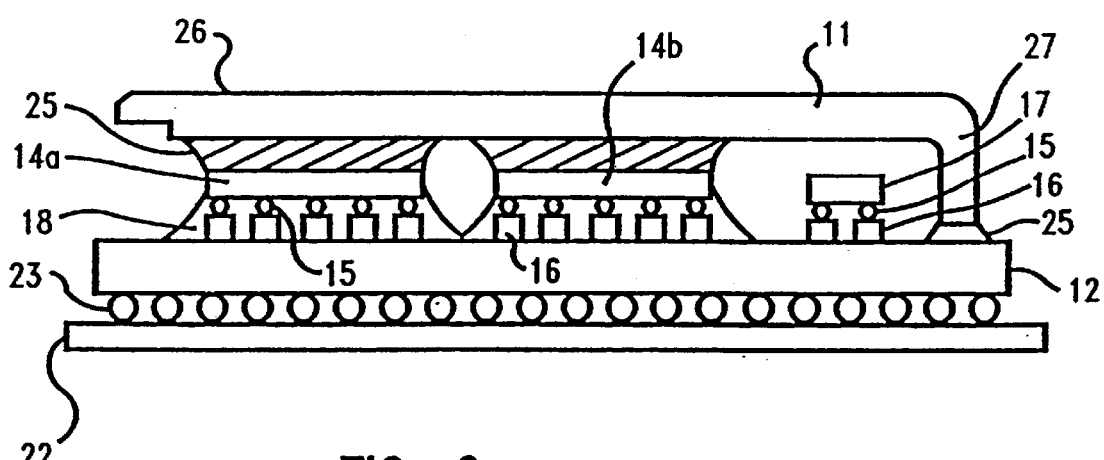
FIG. 6 is a sectional elevational view of yet another preferred embodiment of this invention showing multiple chips under a lid which has an external support extending down to the substrate.

FIG. 6 illustrates yet another preferred embodiment of this invention which allows for the addition of one or more external supports 27 to lid 11 for applications which contain a single or a plurality of chips 14a, 14b, and require even more mechanical support than the attachment of lid 11 to chips 14a, 14b alone can provide. The use of external supports 27, which extends downward from the horizontal portion of lid 11 to the surface of substrate 12, acts to balance the mechanical assembly of lid 11 as well as prevent undesirable tilting across the chip-to-lid interface. For example, a thinner, less rigid lid 11 could be used with external supports 27 to decrease lid 11 flexure and increase the overall rigidity of lid 11, while decreasing overall assembly height. Additionally, when relatively small chips 14a, 14b are used, resulting in a small contact area between the lid and the chips, external supports 27 can be used to elevate the overall adhesion strength of the lid to the chips and the substrate, thus reducing or eliminating lid damage at the chip-to-lid interface under a mechanical load condition. Silicone elastomer adhesive 25 can be used to secure the cap support to the substrate 12, if desired. The preferred underfill material 18 is used to provide mechanical and environmental protection for the chips 14a, 14b. This configuration is also compatible with other electronic components such as decoupling capacitors 17 connected by solder balls 15 on pads 16.

Figure 7:
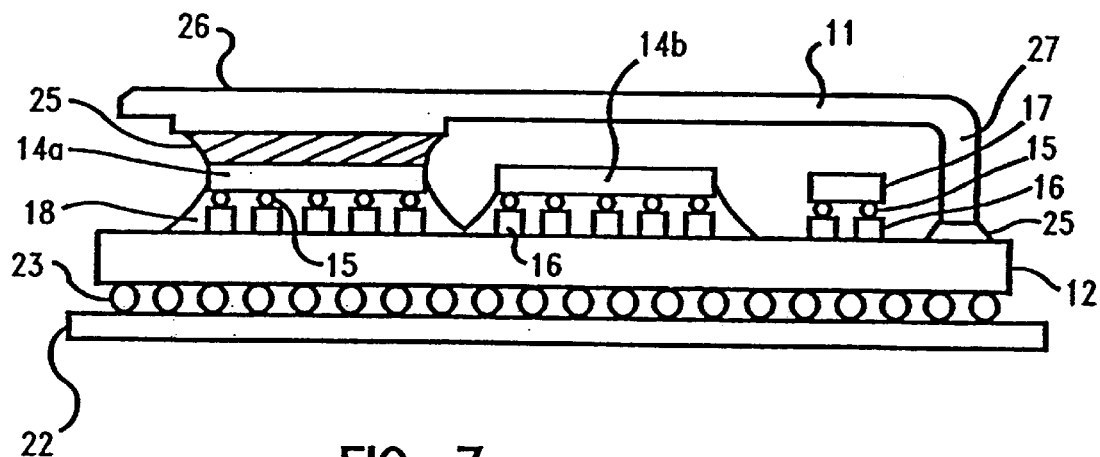
FIG. 7 is a sectional elevational view of yet another preferred embodiment of this invention showing multiple chips under a lid which has an external support extending down to the substrate, with one of the chips having no adhesive connection to the lid.

FIG. 7 illustrates yet another preferred embodiment of this invention for applications where a plurality of chips 14a, 14b are installed, but one or more of chips 14b are located preferably underneath lid 11, but not adhered to lid 11. Contact of lid 11 to one or more chips 14a provides sufficient heat removal from the module while remaining chips 14b, typically dissipating lower power, can operate safely under free convection. The preferred underfill material 18 is used to provide mechanical and environmental protection for the chips 14a, 14b. This configuration is also compatible with other electronic components such as decoupling capacitors 17 connected by solder balls 15 on pads 16. Additionally, this configuration is also compatible with one or more external supports 27.

Figure 8:
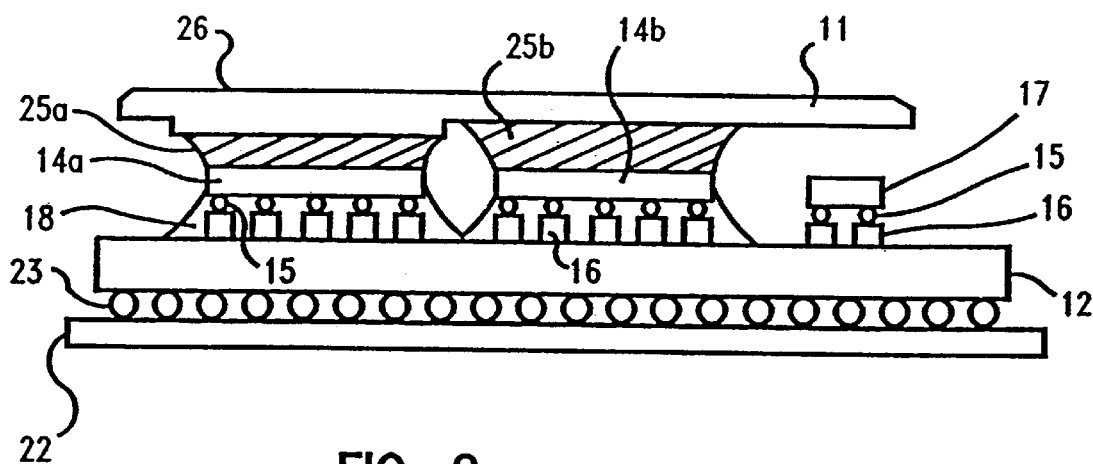
FIG. 8 is a sectional elevational view of still yet another preferred embodiment of this invention showing multiple chips with different thicknesses of silicone adhesive between the chips and lid.

FIG. 8 illustrates still another preferred embodiment of this invention. For several chip applications in which the power dissipation of one chip 14a, for example, a microprocessor or ASIC, is much greater than another surrounding chip 14b, which can typically be a memory device, it is possible to provide designed thermal contact between both types of chips using the same flexible silicone elastomer adhesive 25, thus minimizing the temperature difference between both devices. While a close fitting silicone adhesive-filled gap 25a would normally be maintained for chip 14a with the greatest power, a larger silicone adhesive-filed gap 25b is produced between adjoining memory chip 14 and lid 11. This configuration is also compatible with the use of other electronic components such as decoupling capacitors 17 connected by solder balls 15 on pads 16.

The advantages of electronic packages or modules such as those disclosed herein are many. The silicone elastomer provides a highly efficient thermal path for heat dissipation, mechanical support for the cooling members, with resultant higher thermal performance, and flexibility to absorb large relative strains caused by differing thermal expansions of the chip and cooling members. Also, the cost of the package is reduced due to (a) fewer process steps to assemble the module, (b) the elimination of the cap, cap seal, thermal compound and related steps and (c) the elimination of yield loss associated with cap misalignment and cap seal leak. Furthermore, this inventive structure provides a more efficient use of the substrate top surface area since nearly all of the substrate top surface area is available for electronic components and other features. Additionally, a package assembled in this fashion will perform at JEDEC level 1 with respect to moisture sensitivity (i.e., no moisture sensitivity) is tape and reel compatible for high speed assembly, protects fragile electronic components from handling damage during electrical testing, and enables the use of inexpensive clip-on type heatsinks while allowing the chip junction temperature to reach 125° C. for lidded modules. Lid reworkability may be achieved by shear or torsion removal of the lid, removal of adhesive residues from the chip, for example by mechanical means such as high velocity particles, and reattachment of the lid by the disclosed method.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of providing a direct thermally conductive path between at least one chip and at least one heatsink cap of a semiconductor chip assembly wherein said method comprises the steps of:
   a) providing a substrate having an upper surface for carrying one or more semiconductor chips and at least one semiconductor chip mounted on the upper surface of said substrate; and a heatsink cap for covering said semiconductor chip and said upper surface of said substrate, whereby said heatsink cap allows sides of said semiconductor chip to remain at least partially exposed to an environment outside said semiconductor chip assembly, said heatsink cap and said semiconductor chip having differing coefficients of thermal expansion;

b) applying a flexible silicone elastomeric adhesive between said semiconductor chip and said heatsink cap whereby said flexible silicone elastomeric adhesive is at least partially exposed to said environment outside the semiconductor chip assembly between the heatsink cap and the substrate;

c) securing said heatsink cap to said substrate by means of a mechanical fixture;

d) heating said flexible silicone elastomeric adhesive to cure said flexible silicone elastomeric adhesive; and e) removing the mechanical fixture, whereby the cured flexible silicone elastomeric adhesive has sufficient bond strength to both secure said heatsink cap to said semiconductor chip without additional mechanical constraint of adhering the heatsink cap directly to the substrate while providing a direct thermally conductive path and providing flexibility to absorb strains caused by said differing coefficients of thermal expansion of said semiconductor chip and said heatsink cap, thereby permitting sufficient heat flow from said semiconductor chip to said heatsink cap in a direct thermal conduction system to maintain steady state operation of said semiconductor chip.

2. The method of claim 1 wherein said flexible silicone elastomeric adhesive comprises a primerless, two-part polysiloxane-based adhesive.

3. The method of claim 1 wherein said flexible silicone elastomeric adhesive comprises a primeness, two-part polysiloxane-based adhesive made by reacting polydimethyl siloxane, an organosilicon compound, a polysiloxane, and a silane, in the presence of a catalyst.

4. The method of claim 1 further including the step of securing at least one portion of said semiconductor chip to said substrate using at least one electrical connection.

5. The method of claim 1 wherein the flexible silicone elastomeric adhesive is cured to support a cooling member mass of at least 100 grams.

6. A method of forming an integrated circuit having a direct thermal conductive path between a semiconductor chip and a heat sink cap of a semiconductor chip assembly comprising:

providing a substrate having an upper surface for carrying a semiconductor chip;

securing said semiconductor chip on the upper surface of said substrate;

providing a heat sink cap over said semiconductor chip whereby said heat sink cap extends horizontally outward over said semiconductor chip and said upper surface of said substrate allowing peripheral edges of said semiconductor chip to remain at least partially exposed to an environment outside the semiconductor chip assembly between said heat sink cap and said substrate, said heatsink cap and said semiconductor chip having differing coefficients of thermal expansion; and providing a flexible, heat-curable silicone elastomer based adhesive directly between said semiconductor chip and said heat sink cap whereby said flexible, heat-curable silicone elastomeric based adhesive is exposed to said environment outside the semiconductor chip assembly, said flexible, heat-curable silicone elastomeric based adhesive having sufficient bond strength to directly secure said heat sink cap to said semiconductor chip without additional mechanical constraint while providing a direct thermally conductive path and providing flexibility to absorb strains caused by said differing coefficients of thermal expansion of said semiconductor chip and said heatsink cap to permit sufficient heat flow from said semiconductor chip to said heat sink cap in a direct thermal conduction system to maintain steady state operation of said semiconductor chip.

7. The method of claim 6 wherein said semiconductor chip is secured to said substrate by an electrical connection selected from the group consisting of solder balls, solder columns, pads and pins.

8. The method of claim 7 further including the step of encapsulating said electrical connection by providing an underfill material whereby said underfill material encapsulates at least a portion of said electrical connection.

9. The method of claim 6 including a plurality of semiconductor chips mounted on the upper surface of said substrate having different heights, and wherein said heat sink cap covers said plurality of semiconductor chips and said upper surface of said substrate such that said flexible, heat-curable silicone elastomer based adhesive is disposed directly between said plurality of semiconductor chips and said heat sink cap at different thicknesses dependent on the height of each of said plurality of semiconductor chips.

10. The method of claim 6 including a plurality of semiconductor chips mounted on the upper surface of said substrate, and wherein said heat sink cap covers said plurality of semiconductor chips and said upper surface of said substrate such that said flexible, heat-curable silicone elastomer based adhesive is disposed directly between fewer than all of said plurality of semiconductor chips and said heat sink cap.

11. The method of claim 6 wherein said heat sink cap further includes a flat planar upper surface for attaching an additional heat sink.

12. The method of claim 6 wherein said flexible, heat-curable silicone elastomer based adhesive comprises a flexible, heat-curable silicone elastomer based adhesive retaining flexibility down to operating temperatures of −55° C.

13. The method of claim 6 wherein said flexible, heat-curable silicone elastomer based adhesive comprises a flexible, heat-curable silicone elastomer based adhesive having additional thermally conductive fillers.

14. The method of claim 6 wherein said flexible, heat-curable silicone elastomer based adhesive comprises a primeness polysiloxane-based adhesive produced from a flowable two-part, heat curable silicone elastomer made by reacting polydimethyl siloxane, an organosilicon compound, a polysiloxane, and a silane, in the presence of a catalyst.

15. The method of claimed 6 wherein said flexible, heat-curable silicone elastomer based adhesive applied directly between said semiconductor chip and said heat sink cap is applied to the top surface of the semiconductor chip or to the corresponding area on the heat sink cap.

* * * * *